(12) United States Patent
Liang

(10) Patent No.: US 9,952,301 B2
(45) Date of Patent: Apr. 24, 2018

(54) SYSTEM AND METHOD FOR SELECTING AND MODIFYING A HANGING PROTOCOL FOR DISPLAYING MRI INFORMATION

(71) Applicant: HOLOGIC, INC., Bedford, MA (US)

(72) Inventor: Jiachao Liang, Palo Alto, CA (US)

(73) Assignee: Hologic, Inc., Marlborough, MA (US)

( * ) Notice: Subject to any disclaimer, the term of this patent is extended or adjusted under 35 U.S.C. 154(b) by 537 days.

(21) Appl. No.: 14/643,827

(22) Filed: Mar. 10, 2015

(65) Prior Publication Data
US 2015/0260816 A1 Sep. 17, 2015

Related U.S. Application Data

(60) Provisional application No. 61/951,130, filed on Mar. 11, 2014.

(51) Int. Cl.
G01V 3/00 (2006.01)
G01R 33/56 (2006.01)
G01R 33/54 (2006.01)

(52) U.S. Cl.
CPC ....... G01R 33/5608 (2013.01); G01R 33/546 (2013.01)

(58) Field of Classification Search
USPC ........................................ 324/309
See application file for complete search history.

(56) References Cited

U.S. PATENT DOCUMENTS

| | | | |
|---|---|---|---|
| 2006/0146071 A1* | 7/2006 | Morita | G06Q 50/22 345/619 |
| 2007/0122021 A1* | 5/2007 | Zingaretti | G06T 7/0014 382/132 |
| 2007/0127790 A1* | 6/2007 | Lau | G06F 17/30265 382/128 |
| 2007/0127795 A1* | 6/2007 | Lau | G06F 17/3028 382/128 |
| 2007/0197909 A1* | 8/2007 | Kariathungal | A61B 5/411 600/437 |
| 2008/0025585 A1* | 1/2008 | Novatzky | G06F 19/321 382/128 |
| 2008/0166070 A1* | 7/2008 | Kariathungal | A61B 6/463 382/305 |
| 2010/0054555 A1* | 3/2010 | Owen | G06F 19/321 382/128 |
| 2010/0063842 A1* | 3/2010 | Carroll | A61B 5/7435 705/3 |
| 2010/0080427 A1* | 4/2010 | Yeluri | G06F 19/321 382/128 |
| 2010/0135543 A1* | 6/2010 | Weese | G06T 11/001 382/128 |
| 2010/0211409 A1* | 8/2010 | Kotula | G06Q 10/06 705/3 |
| 2014/0139402 A1* | 5/2014 | Pavlov | G06F 3/1454 345/1.1 |

(Continued)

Primary Examiner — Rodney Fuller
(74) Attorney, Agent, or Firm — Vista IP Law Group LLP

(57) ABSTRACT

A computer implemented method for processing MRI image data and displaying MRI images includes analyzing MRI image data to identify an image acquisition protocol used to acquire the MRI image data, and displaying a plurality of MRI images obtained from the MRI image data, wherein the MRI images are displayed in an order and/or arrangement based at least in part upon the identified image acquisition protocol.

19 Claims, 5 Drawing Sheets

(56) References Cited

U.S. PATENT DOCUMENTS

| | | | | |
|---|---|---|---|---|
| 2014/0143710 A1* | 5/2014 | Zhao | ................ | G06F 19/321 715/781 |
| 2015/0379210 A1* | 12/2015 | Serlie | ................ | G06F 19/322 705/3 |
| 2017/0038951 A1* | 2/2017 | Reicher | ................ | G06F 19/321 |

* cited by examiner

SYSTEM AND METHOD FOR SELECTING AND MODIFYING A HANGING PROTOCOL FOR DISPLAYING MRI INFORMATION

RELATED APPLICATION DATA

The present application claims the benefit under 35 U.S.C. § 119 to U.S. provisional patent application Ser. No. 61/951,130, filed Mar. 11, 2014. The foregoing application is hereby incorporated by reference into the present application in its entirety.

FIELD

The disclosed inventions relate generally to the acquisition and display of Magnetic Resonance Imaging ("MRI") information, and more particularly to the selection and modification of a hanging protocol for displaying MRI images in a preferred order and/or arrangement, regardless of the image acquisition protocol used to originally acquire the images.

BACKGROUND

MRI imaging is well-known for medical applications, in which three dimensional (i.e., volumetric) imaging information of a region of a patient's body is acquired and displayed for diagnostic purposes. The MRI information may be acquired using a variety of modalities and a number of different acquisition devices.

When a substance such as human tissue is subjected to a uniform magnetic field (polarizing field $B_0$), the individual magnetic moments of the excited nuclei in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, $M_z$, may be rotated, or "tipped", into the x-y plane to produce a net transverse magnetic moment $M_t$. A signal is emitted by the excited nuclei or "spins", after the excitation signal $B_1$ is terminated, and this signal may be received and processed to form an image.

When utilizing these "MR" signals to produce images, magnetic field gradients ($G_x$, $G_y$ and $G_z$) are employed. Typically, the region to be imaged is scanned by a sequence of measurement cycles in which these gradients vary according to the particular localization method being used. The resulting set of received MR signals are digitized and processed to reconstruct the image using one of many well-known reconstruction techniques.

The measurement cycle used to acquire each MR signal is performed under the direction of a pulse sequence produced by a pulse sequencer. Clinically available MRI systems, for example, store a library of such pulse sequences that can be prescribed to meet the needs of many different clinical applications.

After image reconstruction, the reconstructed image is stored in an MRI image file, which can be stored either locally, or in a Picture Archive Communication System (PACS). MR image files are usually in a vendor-independent format called Digital Imaging and Communications in Medicine ("DICOM"). Using the DICOM format, each MR image file has a header portion and a body portion. The header portion contains information similar to that located in the raw data header as well as information about the specific corresponding imaging slice, e.g. image slice number. The body portion contains the actual image data. Typically, each MR image file contains image data about one imaging slice.

There are a number of parameters that influence the strength of the signal obtained from an MRI scanner, and the appearance of the acquired image. Some of these parameters are controlled by the operator of the scanner, such as the repetition time ("TR"), the echo time ("TE"), and the flip angle $\alpha$. Other parameters are characteristics of the tissue being studied, such as the relaxation times $T_1$ and $T_2$. In principle, the unambiguous interpretation of an image involves only the observation and determination of the tissue dependent parameters, such as $T_1$ and $T_2$. In practice, however, these parameters are at least partially obscured by differing selections of TR and TE.

Image contrast between tissue components results from differential rates of "relaxation", i.e., the transition from transverse magnetization back to longitudinal magnetization. $T_1$ and $T_2$ are two different relaxation constants that result in different image contrast highlighting different tissue components. To create a $T_1$-weighted image, magnetization of the tissue is allowed to recover before measuring the MR signal by changing the TR. This image weighting is useful for post-contrast imaging. To create a $T_2$-weighted image, magnetization of the tissue is allowed to decay before measuring the MR signal by changing the TE. The MRI image can be biased toward either $T_1$-weighted or $T_2$-weighted images, and thereby vary the contrast between tissue components (e.g., fat, muscle, and water), by choosing imaging parameters for the MRI scan, resulting in different image acquisition protocols. In $T_1$-weighted MRI images, fat has higher contrast and water has lower contrast. In $T_2$-weighted MRI images, water has lower contrast and fat has higher contrast. In both $T_1$ and $T_2$ weighted MRI images, air and dense bone (no fat) has the lowest contrast.

Commercially available computer-controlled workstations employ a number of common types of displays to communicate MRI information to a reviewer. For example, MRI displays for the study of breast tissue, e.g., to identify the presence and location of cancer lesions, are well-known. Such MRI displays for breast tissue typically display images showing various two-dimensional slices taken through one or both breasts, and provide the reviewer with the ability to scroll through the respective tissue image slices using a common device, such as mouse. This scrolling enables the reviewer to readily view different slices, eventually covering the entire breast region.

A system operator (e.g., a radiologist, technician, or other medical professional) may employ the MRI scanner to acquire volumetric image information of the patient tissue (e.g., a breast) using different MRI parameters to emphasize different physiological information. For example, $T_2$-weighted images may be acquired with one set of acquisition parameters, and would show different information from $T_1$-weighted images acquired with different scanner parameters. In addition, a set of images (e.g., $T_1$-weighted) may be acquired before the administration of a contrast agent, and thereafter for several time periods after the contrast agent has entered the blood stream.

Typical MRI image acquisition protocols include $T_2$-weighted and multi-phase $T_1$-weighted series/sequences. Some MRI image acquisition protocols also include high-resolution $T_1$-weighted sequences for anatomy clinical read-out only. Multi-phase $T_1$-weighted sequences can include pre-contrast and post-contrast $T_1$-w sequences and dynamic series. Other MRI image acquisition protocols also include advanced diffusion sequences, which measure the diffusion of water molecules in biological tissues.

The MRI workstation can also be configured to display a selection of all of these image types, arranged in some order on one or more computer screens. This arrangement of these multiple images is called the hanging protocol ("HP"), and is usually set up by the manufacturer according to the preferences of the particular reviewer. These above-described MRI sequences can be included in various HPs.

HPs are essential features of medical imaging workstation software. Hanging protocols closely correlate with work flow and throughput, and can greatly impact the efficiency of clinical review of MRI data/images. Unlike other medical imaging modalities (e.g., mammograms and tomosynthesis), a standardized HP does not exist for MRI, due to the variations in and the complexities of this imaging modality. For instance, there is no common HP for breast MRI.

HPs vary between manufacturers and acquisition systems. Therefore the reviewer must adjust their reading practice when reviewing images acquired by different systems. This reduces the reviewer's reading efficiency, adding to the time required to read each study. Accordingly, there exists a need for hanging protocols that improve reading efficiency and throughput.

SUMMARY

In one embodiment of the disclosed inventions, a system for analyzing MRI image data and displaying MRI images includes an image processing computer and at least one image display monitor, wherein the image processing computer is programmed or otherwise configured to analyze MRI image data to identify an image acquisition protocol used to acquire the MRI image data, and cause to be displayed on a same or different display monitor of the one or more display monitors a plurality of MRI images obtained from the MRI image data, wherein the MRI images are displayed in an order and/or arrangement based at least in part upon the identified image acquisition protocol. The image processing computer may be programmed or otherwise configured to generate the plurality of displayed MRI images from the MRI image data. In particular, the image processing computer may be programmed or otherwise configured to select the plurality of MRI images to generate based on the identified image acquisition protocol. The image processing computer may be programmed or otherwise configured to obtain the MRI image data directly from an MRI imager, or from a storage device.

In accordance with another embodiment of the disclosed inventions, a computer implemented method for analyzing MRI image data and displaying MRI images includes the steps or acts of analyzing MRI image data to identify an image acquisition protocol used to acquire the MRI image data, and displaying a plurality of MRI images obtained from the MRI image data, wherein the MRI images are displayed in an order and/or arrangement based at least in part upon the identified image acquisition protocol. The method may further comprise generating the plurality of displayed MRI images from the MRI image data, including selecting the plurality of MRI images to generate based on the identified image acquisition protocol. The MRI image data may be obtained directly from an MRI imager, or from a storage device.

In accordance with yet another embodiment of the disclosed inventions, a method for processing and displaying MRI images includes the steps or acts of processing a first set of MRI image data corresponding to a first MRI study, displaying a first plurality of MRI images obtained from the first MRI image data, wherein the first plurality of MRI images are displayed in a first display order, processing a second set of MRI image data corresponding to a second MRI study, comparing to thereby determine a difference between the first set of MRI data and the second set of MRI image data, and displaying a second plurality of MRI images obtained from the second MRI image data, wherein, if the determined difference between the first set of MRI data and the second set of MRI image data is less than a predetermined threshold, the second plurality of MRI images are displayed in the first display order. The method may optionally include displaying a user interface to allow a user to select the first display order. Alternatively, the first display order may be a system default display order. One or both of the first set of MRI image data and second set of MRI image data may be obtained from an MRI imager or from a storage device. The method may further include one or both of (i) generating the first plurality of displayed MRI images from the first set of MRI image data, and (ii) generating the second plurality of displayed MRI images from the second set of MRI image data.

In still another embodiment of the disclosed inventions, a method of processing and displaying MRI images includes obtaining MRI image data corresponding to an MRI study, the MRI image data including a study description, comparing the study description of the MRI image data with each of a plurality of MRI study descriptions, and displaying a plurality of MRI images generated from the MRI image data according to a selected hanging protocol corresponding to an MRI study description of the plurality that matches the study description of the MRI image data. The method may also include displaying the plurality of MRI images generated from the MRI image data according to a default hanging protocol if when the study description of the MRI data does not match any study description of the plurality.

In yet another embodiment of the disclosed inventions, a method of processing and displaying MRI images includes obtaining MRI image data corresponding to an MRI study, the MRI image data including a of series description, comparing the series description of the MRI image data with each of a plurality of MRI series descriptions, and displaying a plurality of MRI images generated from the MRI image data according to a selected hanging protocol corresponding to an MRI series description of the plurality that matches the series description of the MRI image data.

These and other aspects and embodiments of the disclosed inventions are described in more detail below, in conjunction with the accompanying figures.

BRIEF DESCRIPTION OF FIGURES

The drawings illustrate the design and utility of embodiments of the disclosed inventions, in which similar elements are referred to by common reference numerals. These drawings are not necessarily drawn to scale. In order to better appreciate how the above-recited and other advantages and objects are obtained, a more particular description of the embodiments will be rendered, which are illustrated in the accompanying drawings. These drawings depict only typical embodiments of the disclosed inventions and are not therefore to be considered limiting of its scope.

DETAILED DESCRIPTION OF THE ILLUSTRATED EMBODIMENTS

Figure 1:
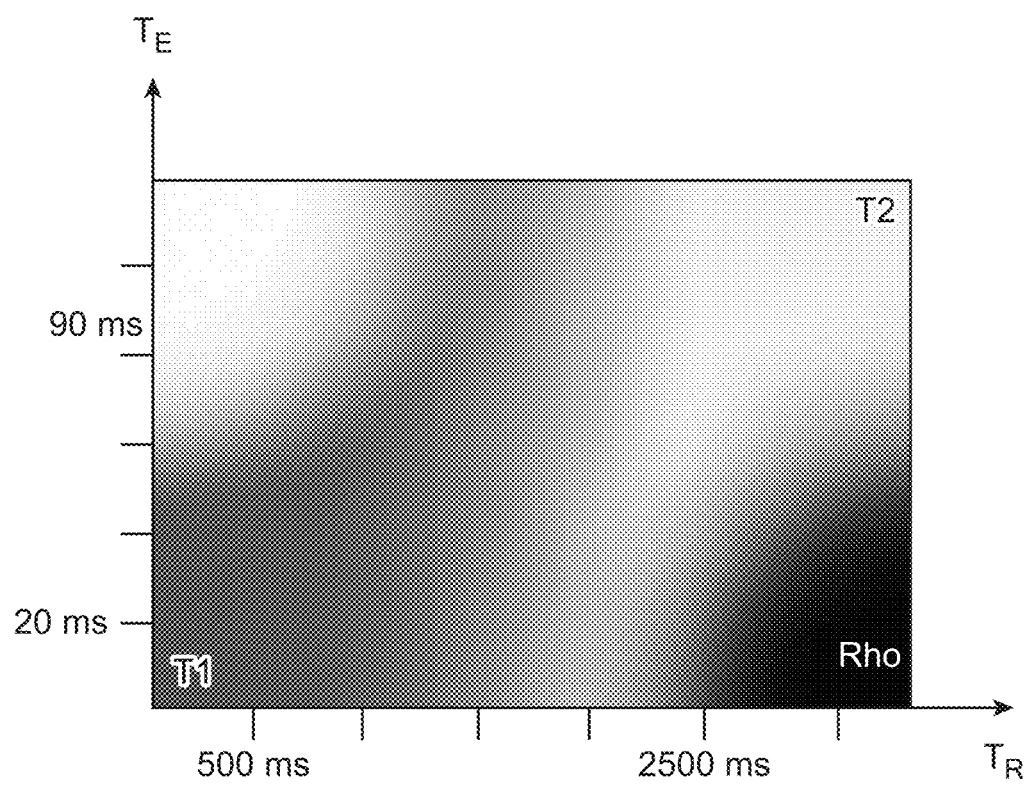
FIG. 1 is a diagram illustrating the relationship between TR, TE, and $T_1$-weighted and $T_2$-weighted series/sequences.

All numeric values are herein assumed to be modified by the terms "about" or "approximately," whether or not explicitly indicated. The terms "about" and "approximately" generally refers to a range of numbers that one of skill in the art would consider equivalent to the recited value (i.e., having the same function or result). In many instances, the terms "about" and "approximately" may include numbers that are rounded to the nearest significant figure. The recitation of numerical ranges by endpoints includes all numbers within that range (e.g., 1 to 5 includes 1, 1.5, 2, 2.75, 3, 3.80, 4, and 5).

As used in this specification and the appended claims, the singular forms "a", "an", and "the" include plural referents unless the content clearly dictates otherwise. As used in this specification and the appended claims, the term "or" is generally employed in its sense including "and/or" unless the content clearly dictates otherwise. In describing the depicted embodiments of the disclosed inventions illustrated in the accompanying figures, specific terminology is employed for the sake of clarity and ease of description. However, the disclosure of this patent specification is not intended to be limited to the specific terminology so selected, and it is to be understood that each specific element includes all technical equivalents that operate in a similar manner. It is to be further understood that the various elements and/or features of different illustrative embodiments may be combined with each other and/or substituted for each other wherever possible within the scope of this disclosure and the appended claims.

Various embodiments of the disclosed inventions are described hereinafter with reference to the figures. It should be noted that the figures are not drawn to scale and that elements of similar structures or functions are represented by like reference numerals throughout the figures. It should also be noted that the figures are only intended to facilitate the description of the embodiments. They are not intended as an exhaustive description of the invention or as a limitation on the scope of the invention, which is defined only by the appended claims and their equivalents. In addition, an illustrated embodiment of the disclosed inventions needs not have all the aspects or advantages shown. An aspect or an advantage described in conjunction with a particular embodiment of the disclosed inventions is not necessarily limited to that embodiment and can be practiced in any other embodiments even if not so illustrated.

For the following defined terms and abbreviations, these definitions shall be applied throughout this patent specification and the accompanying claims, unless a different definition is given in the claims or elsewhere in this specification:

A hanging protocol ("HP") refers to a set of programming instructions outlining the arrangement of images from a clinical study on one or more computer screens. HPs may include information regarding the selection of images for display, the position, size and layout of the images on the computer screens, and the size of windows on the computer screens.

The noun "display" refers to a device used for presenting one or more images for visualization. For example, a display may include one or more computer screens.

An MRI series or sequence is an MRI procedure using a specific set of parameters to generate a specific type of MRI data. The terms MRI series and MRI sequence also describe the MRI data resulting from these MRI procedures.

An MRI study is a clinical procedure using MRI to examine a patient or a portion of a patient's body. An MRI study can include a plurality of MRI series or sequences. The term MRI study also describes the MRI data resulting from this clinical procedure.

The term MRI image encompasses information, in whatever form, that is sufficient to describe an image resulting from an MRI study for display, further processing, or storage. MRI images are typically provided in digital form prior to being displayed, with each image being defined by information that identifies the properties of each pixel in a two-dimensional array of pixels. The pixel values typically relate to the measured, estimated, or computed responses to the applied magnetic field of corresponding volumes in the patient tissue.

The terms "generating an image" and "transmitting an image" respectively refer to generating and transmitting information that is sufficient to describe the image for display. The generated and transmitted information is typically digital information.

As discussed above, current HPs vary between acquisition system manufacturers and between acquisition systems. HPs also vary depending on specific MRI parameters as set forth by a system operator for each acquisition system. Accordingly, one way to improve reading efficiency and throughput is to implement a universal HP that is not dependent on manufacturer, acquisition system or operator-set parameters, but rather sorts the MRI data based on relevant physiological parameters/data of interest to the reviewer.

Different functional series/sequences in MRI data can be differentiated by analyzing acquisition settings in the MRI data's DICOM header. For instance, a limited number of consistent functional sequences are used in breast MRI image acquisition protocols. These include $T_1$-weighted and $T_2$-weighted sequences.

$T_1$-weighted and $T_2$-weighted images/sequences can be differentiated using TR and TE. $T_1$-weighted images/sequences typically have a short TR and a short TE. $T_2$-weighted images/sequences typically have a long TR and a long TE. Proton density-weighted ("Rho-weighed") sequences typically have a long TR and a short TE. For clinical MRI, TE is typically shorter than TR. A short TR is typically less than 500 ms (the approximate average TR for a $T_1$-weighted image/sequence). A long is typically greater than 1,500 ms. A short TE is typically less than 30 ms. A long TE is typically greater than 90 ms. FIG. 1 graphically illustrates the typical TE and TR values of $T_1$-weighted, $T_2$-weighted, and Rho-weighted images/sequences.

Most breast MRI image acquisition protocols include only $T_1$-weighted and $T_2$-weighted (with or without fat saturation) sequences to reduce procedure time. However, MRI image acquisition protocols can also include the following classes of sequences: dynamic sequences; pre-contrast dynamic $T_1$-weighted; first post-contrast dynamic $T_1$-weighted; delay post-contrast dynamic $T_1$-weighted; pre or post high resolution $T_1$-weighted (with or without fat saturation); diffusion weighted imaging ("DWI"); and derived series images with motion correction ("MOCO").

Figure 2:
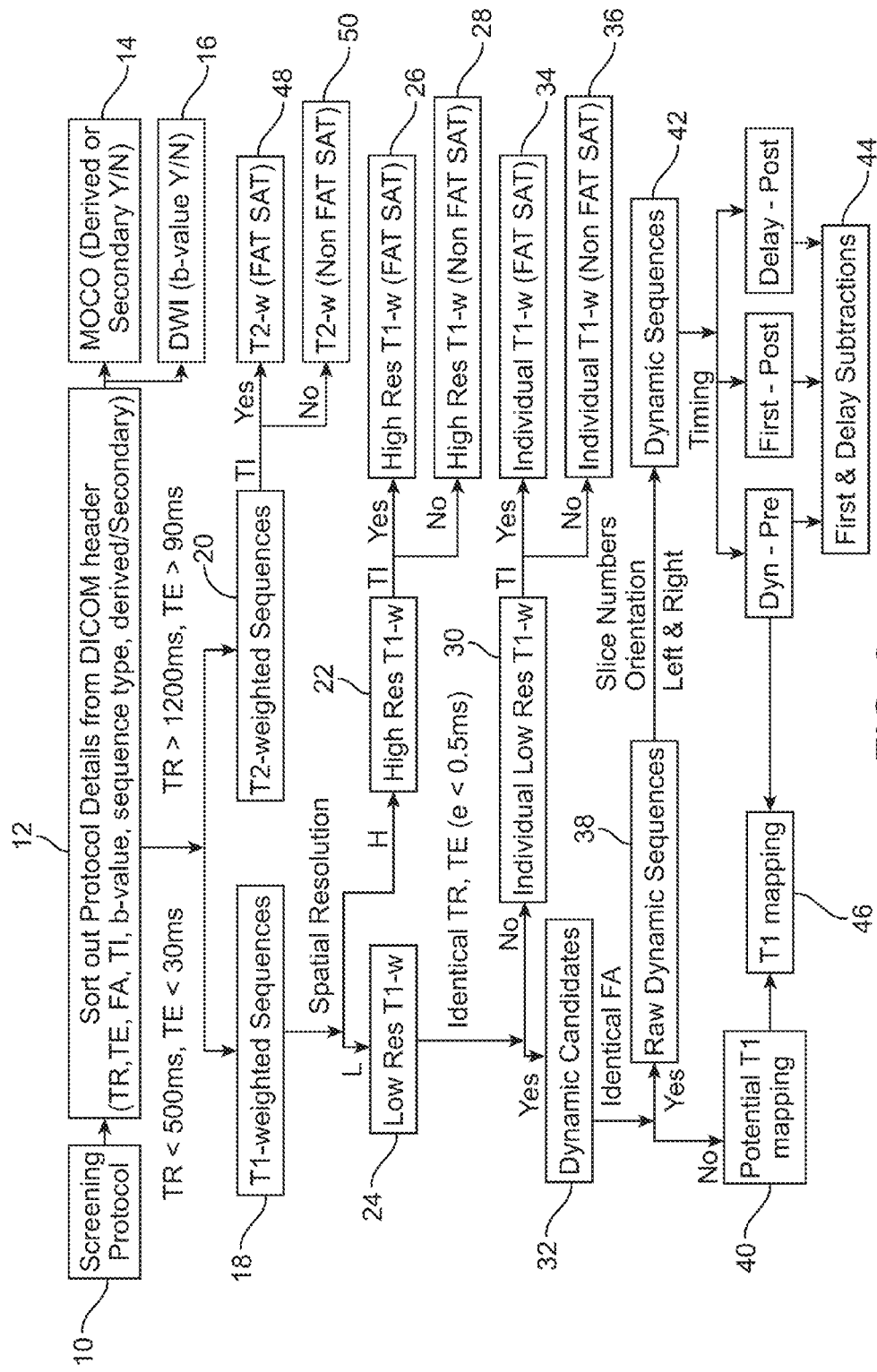
FIG. 2 is a flow chart illustrating a method of categorizing MRI data according to one embodiment of the disclosed inventions.

The flow chart in FIG. 2 illustrates a computer implemented method of distinguishing these MRI sequences from each other by categorizing the MRI data. At step 10, the computer receives the MRI data in the DICOM format, including the DICOM header. At step 12, the computer extracts the protocol details from the DICOM header. Protocol details include: TR; TE; fractional anisotropy ("FA"); inversion time ("TI"); strength of magnetic gradient ("b-value"); sequence type; and derived/secondary.

At step 14, if derived/secondary details are identified in the DICOM header, the MRI data is categorized as a derived series with MOCO. At step 16, if b-values are identified in the DICOM header, the MRI data is categorized as DWI. Diffusion sequences (DWI) can be identified by identifying b-values in their DICOM headings. Diffusion sequences can also be identified by their distinctive echo planar (EPI) sequences. At step 18, if TR from the DICOM header is less than 500 ms and TE from the DICOM header is less than 30 ms, the MRI data is categorized as a $T_1$-weighted sequence. On the other hand, at step 20, if TR from the DICOM header is greater than 1,200 ms and TE from the DICOM header is greater than 90 ms, the MRI data is categorized as a $T_2$-weighted sequence.

For MRI data that has been categorized as a $T_1$-weighted sequence in step 18, the DICOM header is analyzed in steps 22 to 46. At step 22, if the spatial resolution from the DICOM header is high, the MRI data is categorized as a high resolution $T_1$-weighted sequence. At step 24, if the spatial resolution from the DICOM header is low, the MRI data is categorized as a low resolution $T_1$-weighted sequence. While high and low spatial resolution are relative terms, in some embodiments, high spatial resolution can be any resolution smaller than 0.8-1.0 mm and low spatial resolution can be any resolution larger than 0.8-1.0 mm.

In high resolution $T_1$-weighted sequences, if the DICOM header includes an inversion time, the sequence is additionally categorized as having fat saturation at step 26. If the DICOM header does not include an inversion time, the sequence is additionally categorized as not having fat saturation at step 28.

In low resolution $T_1$-weighted sequences, if the DICOM header does not include identical TR and TE with a delay of less than 0.5 ms, the MRI data is categorized as an individual low resolution $T_1$-weighted sequence at step 30. If the DICOM header does include identical TR and TE with a delay of less than 0.5 ms, the MRI data is categorized as a potential dynamic sequence at step 32.

In individual low resolution $T_1$-weighted sequences, if the DICOM header includes an inversion time, the sequence is additionally categorized as having fat saturation at step 34. If the DICOM header does not include an inversion time, the sequence is additionally categorized as not having fat saturation at step 36.

For MRI data categorized as a potential dynamic sequence at step 32, if the DICOM header includes identical fractional anisotropy values, the MRI data is categorized as a raw dynamic sequence at step 38. If the DICOM header does not include identical fractional anisotropy values, the MRI data is categorized as a potential $T_1$ mapping sequence at step 40.

For MRI data categorized as a raw dynamic sequence at step 38, if the DICOM header includes slice numbers and left and right orientation values, then MRI data is further categorized as a dynamic sequence at step 42. Further, timing information in the DICOM header can be used to further categorize the MRI data as pre-contrast, first post-contrast, and delay post-contrast dynamic $T_1$-weighted sequences, with first and delay subtractions at step 44. As described above, dynamic sequences can also be distinguished from high resolution $T_1$-weighted sequences by comparing imaging spatial resolutions.

For MRI data categorized as a potential T1 mapping sequence at step 40, if the DICOM header includes a plurality of flip angles, with other acquisition parameters associate with each flip angle being identical, the MRI data is categorized as a T1 mapping sequence at step 46. The various flip angle T1 mapping sequences can include dynamic pre data. In such cases, the various T1 mapping acquisition sequences can repeat dynamic pre data with the only changed parameter being the flip angle.

For MRI data that has been categorized as a $T_2$-weighted sequence in step 20, if the DICOM header includes an inversion time, the sequence is additionally categorized as having fat saturation at step 48. If the DICOM header does not include an inversion time, the sequence is additionally categorized as not having fat saturation at step 50.

Figure 3:
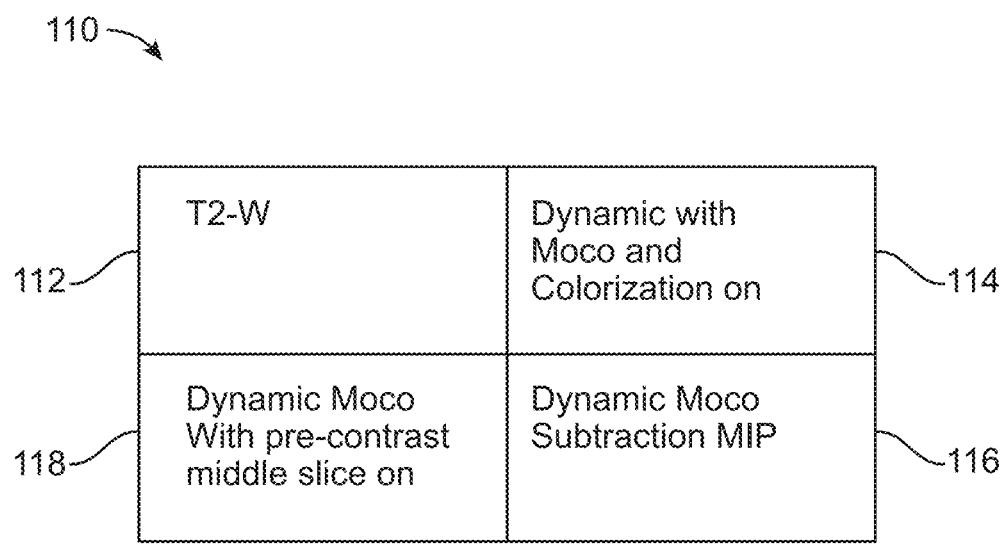
FIG. 3 is a diagram illustrating a default HP according to one embodiment of the disclosed inventions.

FIG. 3 depicts a default HP according to one embodiment of the disclosed inventions. For each MRI study, the system presents various images from the MRI data on a display according to the default HP, which can include one or more computer screens (e.g., four screens). The system presents a $T_2$-weighted sequence in the upper left quadrant 112 of the display 110. The system also presents a dynamic sequence with MOCO and colorization in the upper right quadrant 114 of the display 110. Further, the system presents a dynamic sequence with MOCO and subtraction maximum intensity projection ("MIP") in the lower right quadrant 116 of the display 110. Moreover, the system presents a dynamic sequence with MOCO and the pre-contrast middle slice indicated in the lower left quadrant 118 of the display 110. MOCO, colorization, subtraction, and MIP can be overlays generated by MRI post-processing. Subtraction imaging is a technique whereby an unenhanced $T_1$-weighted sequence is digitally subtracted from the identical sequence performed after gadolinium administration. By performing this operation, any native $T_1$ signal is removed and the remaining signal on the subtracted images is due solely to enhancement. The default HP depicted in FIG. 3 improves the efficiency and throughput of MRI study evaluation for at least some reviewers.

Figure 4:
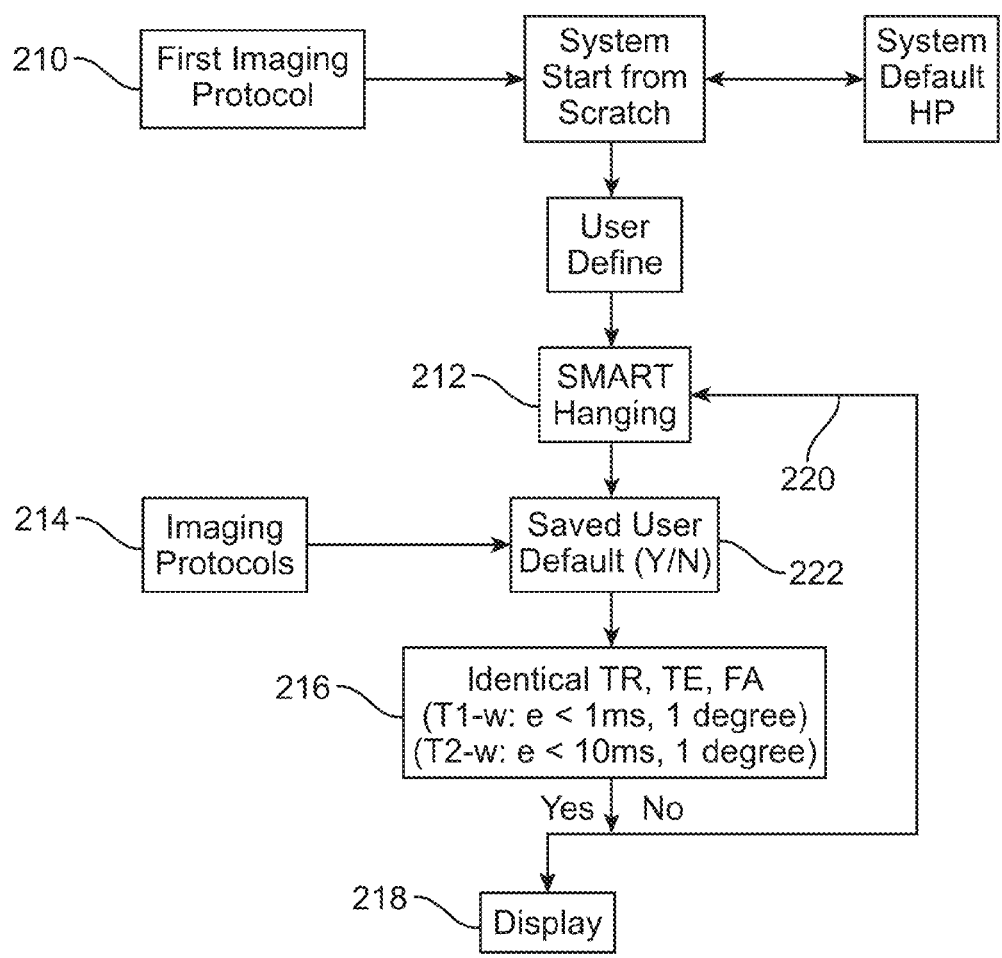
FIG. 4 is a flow chart illustrating the workflow of an MRI review system according to one embodiment of the disclosed inventions.

FIG. 4 depicts the workflow of an MRI review system according to an embodiment of the disclosed inventions. The workflow is controlled by MRI review system software (e.g., "SMART Hanging Software"). At step 210, a first MRI series is transmitted to a newly installed MRI review system (e.g., in DICOM format). The system automatically presents the first MRI series data using a system default HP in step 212. In this embodiment, the system default HP includes a $T_2$-weighted sequence, a dynamic sequence with colorization, and dynamic sequences with subtraction and with and without MIP (divided into quadrants in a display). The system analyzes the MRI series data (e.g., the DICOM header) to categorize and identify the image data for processing into images and display. MRI series data that may be analyzed for categorization and identification include TR, TE, and FA.

At step 214, subsequent MRI series are transmitted to the MRI review system for processing and display. If a subsequent MRI series includes imaging protocols required by the system default HP, the SMART Hanging Software will display the MRI series data according to the default HP.

If the imaging protocols of a subsequent MRI series are modified, the system will evaluate the modifications to determine whether the modified imaging protocols exceed a predetermined buffer range at step 216. An exemplary buffer range include identical TR, TE, and FA with a delay of less than 1 ms and one degree for $T_1$-weighted sequences and less than 10 ms and one degree for $T_2$-weighted sequences. If the modified imaging protocols are within the buffer range, the system will continue to display the MRI series data according to the default HP at step 218. If the modified imaging protocols exceed the buffer range, the system will suggest that the reviewer instruct the software to confirm the modifications to the imaging protocols at step 220. The system also allows the reviewer to overwrite the system default HP and save the modified HP at step 222. During evaluation of an MRI series, the reviewer may modify the layout of the MRI series.

The buffer range provides flexible to the system, allowing it to be more tolerant of and to adapt to small changes in the imaging protocols, such as those made by technicians working with the MRI imagers on site. The method depicted in FIG. 4 improves overall clinical readout work flow, and reduces required system service.

Figure 5:
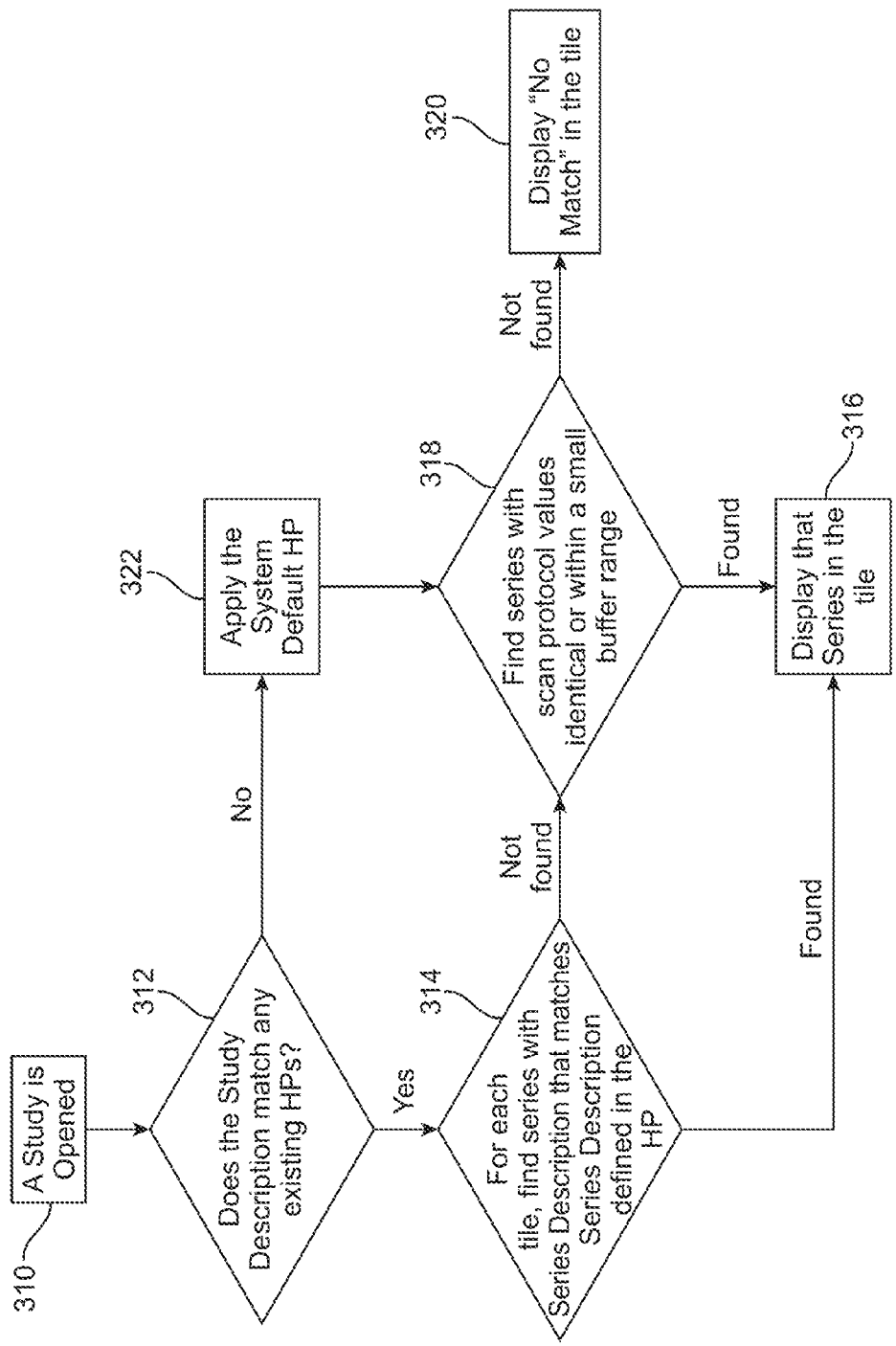
FIG. 5 is a flow chart illustrating the workflow of an MRI review system according to another embodiment of the disclosed inventions.

FIG. 5 depicts the workflow of an MRI review system according to another embodiment of the disclosed inventions. The workflow is controlled by MRI review system software (e.g., "SMART Hanging Software"). At step 310, data from an MRI study (including several MRI series) is transmitted to the MRI review system (e.g., in DICOM format). The MRI data includes a study description that identifies the type of the MRI study (e.g., "MRI Breast Bilateral With/Without Contrast") and series descriptions that identify the series in the MRI study (see sequences described above). The SMART Hanging Software includes a system default HP, as well as other HPs that may have been previously used in the system to display MRI data. At step 312, the system analyzes the study description of the MRI data (e.g., in the DICOM header) to determine if the MRI study's description matches that of a previously used HPs stored in the SMART Hanging Software. If the MRI data's study description matches that of a previously used HP, attempts to display the MRI data according to the previously used HP.

For each tile of the HP, the system further analyzes the MRI data to determine if a series description of the MRI data matches that of the previously used HP in step 314. If the MRI data's series description matches that of the previously used HP, the system displays that series in step 316.

If the MRI data's series description does not match that of the previously used HP, the system further analyzes the MRI data to determine if a series has scan protocol values identical or within a small buffer range of the previously used HP (as described above with reference to FIG. 4) in step 318. If the MRI data's includes a series with scan protocol values identical or within a small buffer range of the previously used HP, the system displays that series in step 316. Otherwise, the system displays a message to the reviewer in the tile for that series in the HP indicating that there is "No Match" for the series data in step 320.

If the MRI data's study description does not match that of a previously used HP, the system applies the system default HP in step 322 and applies the scan protocol values test in step 318 for each tile of the system default HP.

The above-described HP selection and modification methods and protocols (e.g., SMART Hanging Protocol) provide more flexibility to automatic MRI image hanging without user intervention. The flexibility built into these methods and protocols allow them to adapt to emerging MRI techniques and sequences. While these methods and protocols have been described with respect to breast MRI, they are applicable to and the claims encompass MRI imaging of all tissues (e.g., prostate and central nervous system).

Having described exemplary embodiments, it will be appreciated that the examples described above and depicted in the accompanying figures are only illustrative, and that other embodiments and examples also are encompassed within the scope of the appended claims. For example, while the flow diagrams provided in the accompanying figures are illustrative of exemplary steps; the overall image merge process may be achieved in a variety of manners using other data merge methods known in the art. The system block diagrams are similarly representative only, illustrating functional delineations that are not to be viewed as limiting requirements of the disclosed inventions. Thus the above specific embodiments are illustrative, and many variations can be introduced on these embodiments without departing from the scope of the appended claims. It will also be obvious to those skilled in the art that various changes and modifications may be made (e.g., the dimensions of various parts) without departing from the scope of the disclosed inventions, which are to be defined only by the claims and their equivalents. The specification and drawings are, accordingly, to be regarded in an illustrative rather than restrictive sense.

What is claimed is:

1. A system for analyzing MRI image data and displaying MRI images, comprising:
   an image processing computer; and
   at least one image display monitor,
   wherein the image processing computer is programmed or otherwise configured to
   (i) analyze MRI image data to identify characteristics of an image acquisition protocol used to acquire the MRI image data,
   (ii) determine differences between the identified characteristics of the image acquisition protocol and characteristics corresponding to a default image hanging protocol, and
   (iii) if each of the determined differences is within a respective predetermined buffer range, cause a plurality of MRI images obtained from the MRI image data to be displayed on the at least one image display monitor in accordance with the default image hanging protocol.

2. The system of claim 1, wherein the image processing computer is programmed or otherwise configured to generate the plurality of displayed MRI images from the MRI image data.

3. The system of claim 2, wherein the image processing computer is programmed or otherwise configured to select the plurality of MRI images to generate based on the default image hanging protocol.

4. The system of claim 1, wherein determining the differences between the identified characteristics of the image acquisition protocol and the characteristics corresponding to the default image hanging protocol comprises comparing imaging acquisition protocol data of the MRI image data with image protocol data of a default image acquisition protocol corresponding to the default image hanging protocol.

5. The system of claim 4, wherein the imaging acquisition protocol data of the MRI image data includes data selected from the group consisting of TR, TE, FA, TI, b-value, and sequence type.

6. The system of claim 1, wherein the image processing computer is further programmed or otherwise configured to
   (iv) cause the MRI images to be displayed on the at least one display monitor in accordance with a modified hanging protocol different from the default hanging protocol if any of the determined differences are outside of the predetermined buffer range.

7. The system of claim 6, wherein the image processing computer is programmed or otherwise configured to modify the default hanging protocol to generate the modified hanging protocol based at least in part upon system user instructions.

8. A computer implemented method for analyzing MRI image data and displaying MRI images, comprising:
   analyzing MRI image data to identify characteristics of an image acquisition protocol used to acquire the MRI image data;
   determining differences between the identified characteristics of the image acquisition protocol and characteristics corresponding to a default image hanging protocol; and
   if each of the determined differences is within a respective predetermined buffer range, displaying a plurality of MRI images obtained from the MRI image data, wherein the MRI images are displayed in an order and/or arrangement based upon the default image hanging protocol.

9. The method of claim 8, further comprising generating the plurality of displayed MRI images from the MRI image data.

10. The method of claim 9, further comprising selecting the plurality of MRI images to generate based on the default image hanging protocol.

11. The method of claim 8, wherein determining the differences between the identified characteristics of the image acquisition protocol and the characteristics corresponding to the default image hanging protocol comprises comparing imaging acquisition protocol data of the MRI image data with image protocol data of a default image acquisition protocol corresponding to the default image hanging protocol.

12. The method of claim 11, wherein the imaging acquisition protocol data of the MRI image data includes data selected from the group consisting of TR, TE, FA, TI, b-value, and sequence type.

13. The method of claim 8, further comprising causing the MRI images to be displayed on the at least one display monitor in accordance with a modified hanging protocol different from the default hanging protocol if any of the determined differences are outside of the predetermined buffer range.

14. The method of claim 13, further comprising modifying the default hanging protocol to generate the modified hanging protocol based at least in part upon system user instructions.

15. A method for processing and displaying MRI images, comprising:
   processing a first set of MRI image data corresponding to a first MRI study;
   displaying a first plurality of MRI images obtained from the first MRI image data, wherein the first plurality of MRI images are displayed in accordance with a first hanging protocol;
   processing a second set of MRI image data corresponding to a second MRI study;
   comparing to thereby determine differences between characteristics of an image acquisition protocol used to acquire the first set of MRI data and characteristics of an image acquisition protocol used to acquire the second set of MRI image data; and
   displaying a second plurality of MRI images obtained from the second MRI image data, wherein, if each of the determined differences is less than a respective predetermined threshold, the second plurality of MRI images are displayed in accordance with the first hanging protocol.

16. The method of claim 15, further comprising displaying a user interface to allow a user to select the first hanging protocol.

17. The method of claim 15, further comprising causing the second set of MRI image data to be displayed in accordance with a second hanging protocol different from the first hanging protocol if any of the determined differences are outside of the respective predetermined threshold.

18. The method of claim 17, further comprising modifying the first hanging protocol to generate the second hanging protocol based at least in part upon system user instructions.

19. The method of claim 15, further comprising (i) generating the first plurality of displayed MRI images from the first set of MRI image data, and/or (ii) generating the second plurality of displayed MRI images from the second set of MRI image data.

* * * * *